(12) United States Patent
Kamata

(10) Patent No.: US 8,575,652 B2
(45) Date of Patent: Nov. 5, 2013

(54) SEMICONDUCTOR DEVICE AND MANUFACTURING METHOD THEREOF

(75) Inventor: Yoshiki Kamata, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 471 days.

(21) Appl. No.: 12/353,330

(22) Filed: Jan. 14, 2009

(65) Prior Publication Data

US 2009/0189189 A1 Jul. 30, 2009

(30) Foreign Application Priority Data

Jan. 29, 2008 (JP) .................. 2008-017118

(51) Int. Cl.
*H01L 29/78* (2006.01)
*H01L 21/336* (2006.01)

(52) U.S. Cl.
USPC ........... 257/192; 257/616; 257/617; 257/610; 257/E21.409; 257/E21.317

(58) Field of Classification Search
USPC .................. 257/192, 616, 617, 610, E21.409, 257/E21.317
See application file for complete search history.

(56) References Cited

U.S. PATENT DOCUMENTS

| | | | |
|---|---|---|---|
| 2006/0199323 A1* | 9/2006 | Mitsuda et al. | 438/197 |
| 2007/0057347 A1* | 3/2007 | Ikeda | 257/616 |
| 2008/0121932 A1* | 5/2008 | Ranade | 257/192 |

FOREIGN PATENT DOCUMENTS

| | | |
|---|---|---|
| JP | 1-105548 A | 4/1989 |
| JP | 2004-273551 | 9/2004 |

OTHER PUBLICATIONS

Keiji Ikeda et al., "Modulation of NiGe/Ge Schottky barrier height by sulfur segregation during Ni germanidation", Applied Physics Letters 88, 152115, (2006), 3 pages.

Office Action issued Dec. 11, 2012, in Japanese Patent Application No. 2008-017118 with English translation.

Japanese Office Action mailed Mar. 5, 2013 (with English translation) for Patent Application No. 2008-017118.

\* cited by examiner

*Primary Examiner* — Cathy N Lam

(74) *Attorney, Agent, or Firm* — Oblon, Spivak, McClelland, Maier & Neustadt, L.L.P.

(57) ABSTRACT

An exemplary embodiment provides a semiconductor device, in which a junction leakage current is reduced in MISFET including a source/drain impurity layer formed in a semiconductor region containing Ge, and a semiconductor device manufacturing method. The semiconductor device includes a channel region which is formed in a semiconductor substrate; a gate insulator which is formed on a surface of the channel region; a gate electrode which is formed on the gate insulator; and source/drain impurity layers which are formed on both sides of the channel region. In the semiconductor device, at least part of the source/drain impurity layer is formed in a semiconductor region containing Ge in the semiconductor substrate, and at least an element selected from a group including S, Se, and Te is contained in the semiconductor region which is deeper than a junction depth of the source/drain impurity layer.

2 Claims, 19 Drawing Sheets

SEMICONDUCTOR DEVICE AND MANUFACTURING METHOD THEREOF

CROSS-REFERENCE TO RELATED APPLICATION

This application is based upon and claims the benefit of priority from a Japanese Patent Application No. 2008-17118, filed on Jan. 29, 2008, the entire contents of which are incorporated herein by reference.

FIELD OF THE INVENTION

Described herein is a semiconductor device in which a source/drain impurity layer is formed in a semiconductor region containing Ge and a method for manufacturing the semiconductor device.

BACKGROUND OF THE INVENTION

Improvement of performance of MISFET has been achieved by a scaling-down technique. However, because the scaling-down technique is approaching the limit, the technique of improving the performance of MISFET except for the scaling-down technique is studied. The use of a substrate except for a Si substrate which has electron or hole mobility higher than that of Si, for example, the use of a SiGe substrate or a Ge substrate is studied. Also studied is a technique embedding SiGe or Ge in a source/drain region, and applying a distortion to Si channel, thereby improving the carrier mobility in the Si channel.

A reverse leakage current of a pn junction or a Schottky junction of the source/drain region is increased as a semiconductor band gap Eg is decreased. Si and Ge have band gaps Eg of 1.1 and 0.66 eV at a room temperature (20° C.), respectively. Therefore, the large amount of reverse leakage current of the junction is cited as one of problems with MISFET formed on the SiGe or Ge substrate. Additionally, sometimes various defects are introduced into the semiconductor substrate near the junction during the MISFET forming process. The junction leakage current is further increased according to the amount of defect in a depletion layer near the junction, which worsens the problem.

Examples of the defect generated in the semiconductor crystal include a point defect such as a dangling bond, a dislocation, and a stacking fault. Recently it is reported that the introduction of S (sulfur) is an effective technique of compensating the defect generated in a NiGe/Ge interface. In the Schottky junction formed in the Ge substrate using NiGe, Fermi level pinning (FLP) can be solved by segregating sulfur in a metal/semiconductor interface (K. Ikeda, Y. Yamashita, N. Sugiyama, N. Taoka and S. Takagi, Applied Physics Letters, 88, 152115 (2006)). It is believed that FLP is generated due to the defect existing in the metal/semiconductor interface, and it is believed that sulfur compensates the defect existing in the metal/semiconductor interface to solve the pinning.

Desirably a junction depth Xj of the source/drain region is made shallow to improve controllability by a gate electrode of MISFET. In the Si substrate, it is known that the junction depth Xj can be made shallow by ion implantation of a dopant after the Si substrate is transformed into an amorphous state by Ge ion implantation. However, a technique of forming the shallow junction depth Xj is not known yet in the Ge substrate.

SUMMARY OF THE INVENTION

In accordance with a first aspect, a semiconductor device includes a channel region which is formed in a semiconductor substrate; a gate insulator which is formed on a surface of the channel region; a gate electrode which is formed on the gate insulator; and source/drain impurity layers which are formed on both sides of the channel region, wherein the semiconductor substrate has a semiconductor region containing Ge, at least part of the both source/drain impurity layers are formed in the semiconductor region, and at least an element selected from a group including S, Se, and Te is contained in a region which is part of the semiconductor region, and which is deeper than a junction depth of the source/drain impurity layer.

In accordance with a second aspect, a semiconductor device manufacturing method includes forming a gate insulator on a semiconductor substrate containing Ge; forming a gate electrode on the gate insulator; introducing at least an element selected from a group including S, Se, and Te into the semiconductor substrate; introducing an impurity into the semiconductor substrate on both sides of the gate electrode to form source/drain impurity layers, wherein the element is introduced into a region which is deeper than a junction depth of the source/drain impurity layer.

In accordance with a third aspect, a semiconductor device manufacturing method includes forming a gate insulator on a semiconductor substrate containing Ge; forming a gate electrode on the gate insulater; forming semiconductor regions containing Ge on both sides of the gate electrode in the semiconductor substrate; introducing at least an element selected from a group including S, Se, and Te into the semiconductor substrate; introducing impurities into the semiconductor regions to form source/drain impurity layers, wherein the element is introduced into a region which is deeper than a junction depth of the source/drain impurity layer.

Accordingly, the semiconductor device, in which the junction leakage current is reduced in MISFET including the source/drain impurity layer formed in the semiconductor region containing Ge, and the semiconductor device manufacturing method can be provided.

DETAILED DESCRIPTION OF THE EMBODIMENTS

Embodiments will be described below with reference to the drawings.

(First Embodiment)

A semiconductor device according to a first embodiment has MISFET including a channel region which is formed in a semiconductor substrate containing Ge; a gate insulator which is formed on a surface of the channel region; a gate electrode which is formed on the gate insulator; and source/drain impurity layers which are formed on both sides of the channel region. In the MISFET, the source/drain impurity layer is formed in the semiconductor substrate containing Ge, and at least a kind of an element selected from S (sulfur), Se (selenium), and Te (tellurium) is contained in the semiconductor region which is deeper than a junction depth of the source/drain impurity layer.

Figure 1:
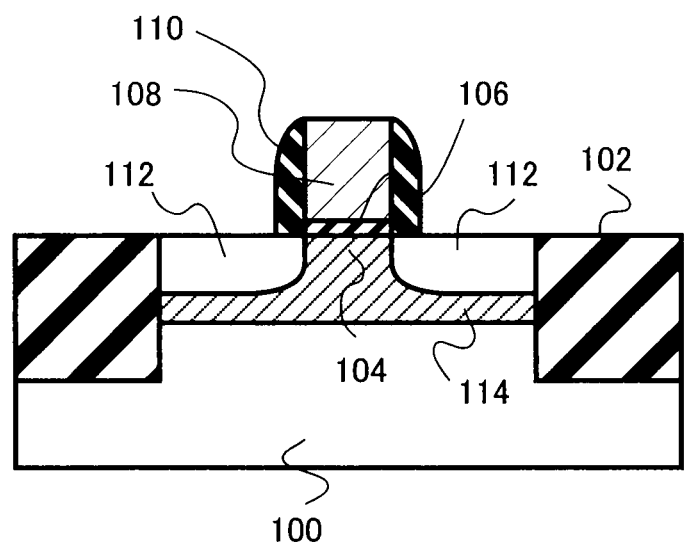
FIG. 1 is a sectional view showing a semiconductor device according to a first embodiment.

FIG. 1 is a sectional view showing the semiconductor device of the first embodiment. A Shallow Trench Isolation (STI) 102 whose trench is filled with a silicon oxide film is provided in an n-type Ge substrate 100. A channel region 104 of p-MISFET is formed in the Ge substrate 100. A gate insulator 106 made of a zirconium silicate (ZrSiO) is formed on a surface of the channel region 104 in p-MISFET. A gate electrode 108 made of a metal is formed on the gate insulator 106. Gate sidewall insulators 110 are formed in both side faces of the gate electrode 108. In the Ge substrate 100, source/drain impurity layers 112 (hereinafter also referred to as source/drain diffusion layers) in which boron (B) is used as an impurity are formed on both sides of the channel region 104. A region 114 containing S which is of a periodic table group 16 is formed in the semiconductor region which is deeper than a junction depth of the source/drain impurity layer 112.

As described later, in the semiconductor device of the first embodiment, the junction leakage current of the source/drain impurity layer is decreased by forming a region containing S in the semiconductor region which is deeper than the junction depth of the source/drain impurity layer. Accordingly, suppression of functional error caused by junction leakage current, a decrease in power consumption, and suppression of heat generation can be realized in the semiconductor device.

Figure 2:
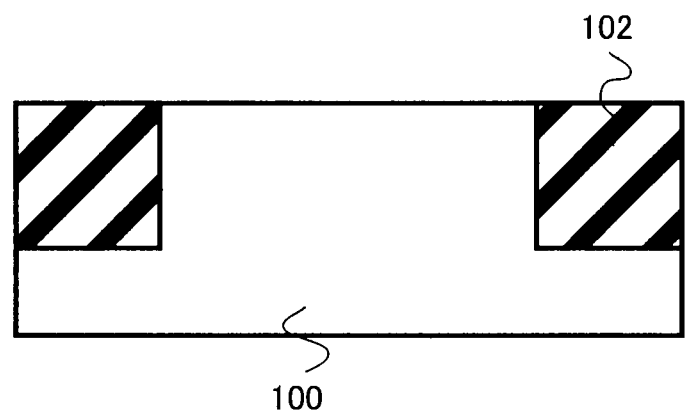
FIGS. 2 to 5 are sectional views showing a process of manufacturing the semiconductor device of the first embodiment.

A method for manufacturing the semiconductor device of the first embodiment will be described below. FIGS. 2 to 5 are sectional views showing a process of manufacturing the semiconductor device of the first embodiment. As shown in FIG. 2, the shallow trench isolation 102 made of the silicon oxide film is formed in the n-type Ge substrate 100.

Figure 3:
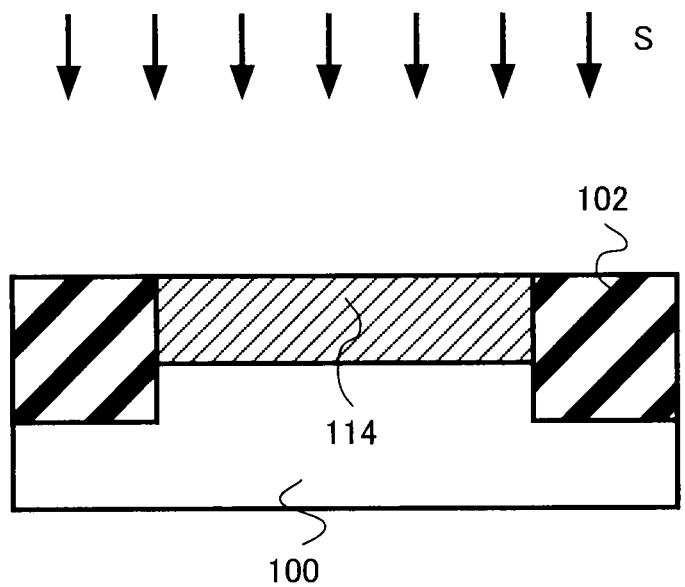

As shown in FIG. 3, after the silicon oxide film (not shown) is deposited to about 10 nm by a sputtering method, S is introduced into the Ge substrate 100 by ion implantation, thereby forming the semiconductor region 114 containing S. At this point, the S ion implantation is performed at an angle of seven degrees (tilt implantation), with an acceleration voltage of 30 KeV and a dose amount of about $5 \times 10^{13}$ to about $5 \times 10^{15}$ (/cm$^2$). In the S ion implantation, an implantation condition is set such that S is implanted deeper than the junction depth of the later-formed source/drain impurity layer.

Figure 4:
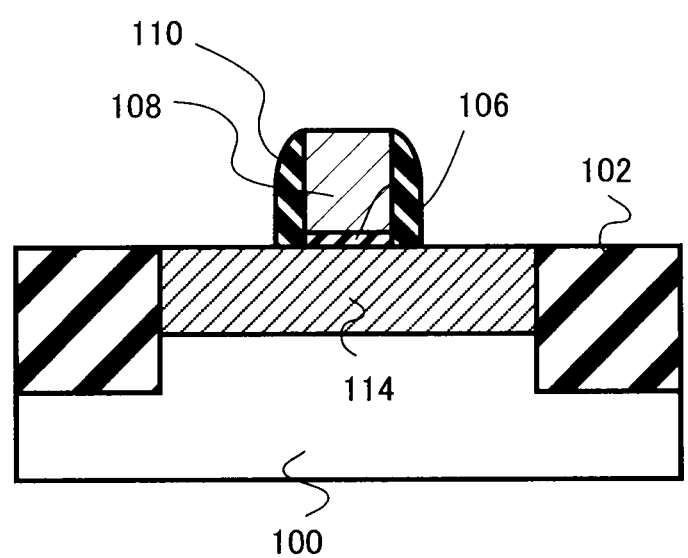

As shown in FIG. 4, after the silicon oxide film (not shown) is removed by etching with a hydrofluoric acid (HF(0.5%)), the gate insulator 106 made of a zirconium silicate (ZrSiO) is deposited to about 20 nm by a sputtering method. Then a metal constituting the gate electrode 108 is deposited by a low pressure chemical vapor deposition (hereinafter also referred to as LP-CVD) method. The gate insulator 106 and the gate electrode 108 are formed by a patterning technique such as a lithography technique and a reactive ion etching (hereinafter also referred to as RIE). After the silicon nitride film is deposited by the LP-CVD method, etch back is performed by the RIE method to left the silicon nitride film in the side face portions of the gate electrode 108, thereby forming the gate sidewall insulators 110.

Figure 5:
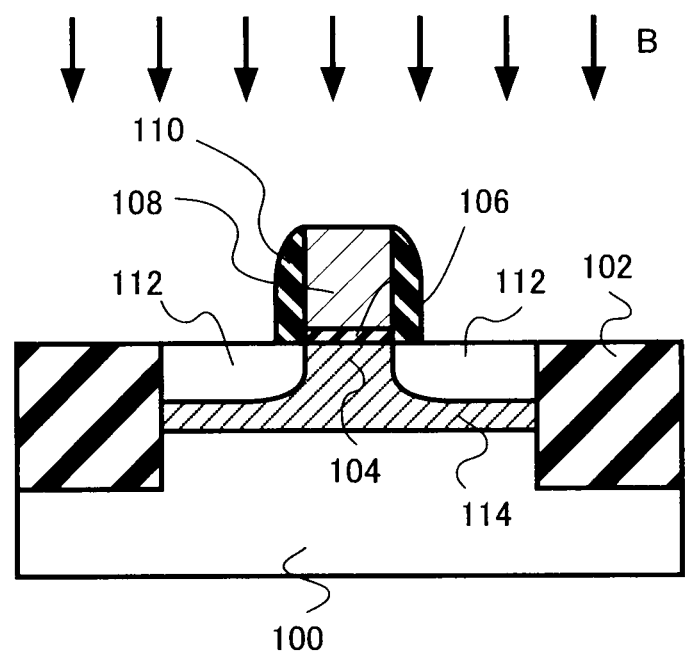

As shown in FIG. 5, the source/drain impurity layer is formed by performing B ion implantation to both sides of the gate electrode 108. At this point, the B ion implantation is performed at an angle of seven degrees (tilt implantation), with an acceleration voltage of 11 KeV and a dose amount of about $5 \times 10^{15}$ (/cm$^2$). Then annealing is performed at 500° C. in order to activate B or S. Thus, the semiconductor device having the structure shown in FIG. 1 is formed.

In the manufacturing method of the first embodiment, as described in detail later, because the Ge single-crystal substrate is transformed into the amorphous state by the S ion implantation, the channeling is suppressed during the B ion implantation. Accordingly, the shallow source/drain impurity layer can be formed.

Figure 6:
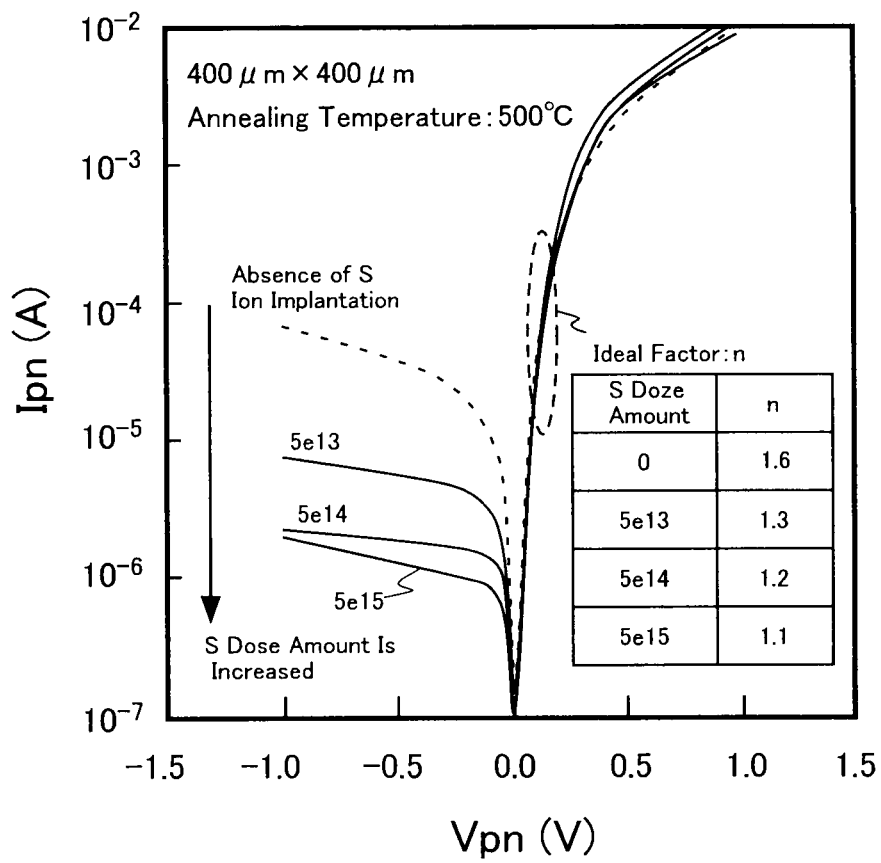
FIG. 6 shows a rectifying characteristic of a p+/n− junction in the first embodiment.

FIG. 6 shows a rectifying characteristic of a p+/n− junction in the Ge substrate formed under the above-described condition. As can be seen from FIG. 6, the reverse leakage current is decreased as the S dose amount is increased, and a generation center amount contributing to the current is decreased. Additionally, as the S dose amount is increased, a forward ideal factor n is improved to decrease a recombination center amount.

As is clear from FIG. 6, the reverse leakage current is largely decreased as much as almost two figures by implantation of S not lower than $5 \times 10^{14}$ atoms/cm$^2$. Accordingly, in the manufacturing method of the first embodiment, desirably the S ion implantation is performed by the dose amount not lower than $5 \times 10^{14}$ atoms/cm$^2$.

The result in which density of the defect contributing to the reverse current is estimated by a reverse current amount is shown to understand a factor of decreasing the reverse leakage current. The following equation (1) is used in the estimation:

[Formula 1]

$$\frac{1}{\tau_{rec}} = \frac{1}{\tau_n} + \frac{1}{\tau_p} \quad (1)$$

$$\tau_n = \frac{1}{\sigma_n v_{th} N_T}$$

$$\tau_p = \frac{1}{\sigma_p v_{th} N_T}$$

$$\tau_{gen} = \tau_p \exp\left(\frac{E_T - E_i}{kT}\right) + \tau_n \exp\left(-\frac{E_T - E_i}{kT}\right)$$

$$I_{pn} = I_{pn0} + I_{gen} = I_{pn0} + \frac{A_J q n_i W}{\tau_{gen}}$$

Table 1 shows a meaning and a numerical value of each parameter. Table 2 collectively shows the experimental results and calculated results estimated from the experimental results. The trap density NT becomes about $4\times10^{15}$ (/cm$^3$) in the case of the S dose amount of $5\times10^{15}$ (/cm$^2$).

TABLE 1

| Parameter | notation | Numerical Value | Unit |
| --- | --- | --- | --- |
| Scattering Cross Section | σ | 5.00E−15 | cm2 |
| Scattering Cross Section | σn | 5.00E−15 | cm2 |
| Scattering Cross Section | σp | 5.00E−15 | cm2 |
| Heat Speed | vth | 1.00E+07 | cm/sec |
| Trap Density | NT | 3.80E+15 | /cm3 |
| Recombination Time | τn | 5.26E−09 | sec |
| Recombination Time | τp | 5.26E−09 | sec |
| Recombination Time | τrec | 2.63E−09 | sec |
| Intrinsic Fermi Level | Ei | 0 | eV |
| Trap Level Measured From Ei | ET | −0.13 | eV |
| Boltzmann Constant | kB | 8.62E−05 | eV/K |
| Measurement Temperature | T | 300 | K |
| Generation Time | τgen | 8.04E−07 | sec |
| Junction Area | Aj | 1.60E−03 | cm2 |
| Elementary Charge | q | 1.60E−19 | C |
| Acceptor Concentration | Na | 2.00E+19 | /cm3 |
| Substrate Concentration | Nd (=Nsub) | 4.00E+14 | /cm3 |
| Substrate Permittivity | εGe | 1.60E+01 | |
| Vacuum Permittivity | ε0 | 8.85E−14 | F/cm |
| Intrinsic Carrier Density Of Substrate | ni | 2.00E+13 | /cm3 |
| Built-In Potential | Vbi | 0.435 | V |
| Voltage Applied To pn Junction | Vpn | −0.250 | V |
| Depletion Layer Width | W | 1.74E−04 | cm |
| Generation Current | Igen | 1.11E−06 | A |

TABLE 2

| Vpn = −0.25 | | S dose (/cm2) | | |
| --- | --- | --- | --- | --- |
| Vpn (V) | 0 | 5.E+13 | 5.E+14 | 5.E+15 |
| Igen | 0.000025409 | 4.6312E−06 | 1.6324E−06 | 1.0949E−06 |
| NT | 8.7E+16 | 1.6E+16 | 5.6E+15 | 3.7E+15 |

Figure 7:
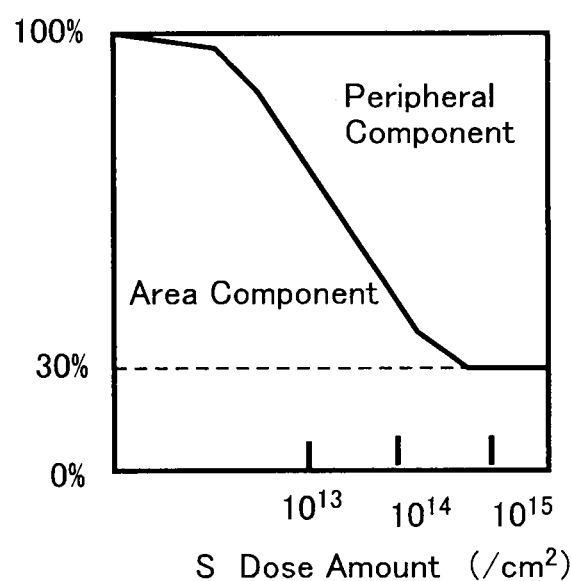
FIG. 7 shows an evaluation results of an S dose amount dependence of an area component and a peripheral component of a reverse current in the first embodiment.

The result in which dependence of a reverse current on a junction area and dependence on a junction peripheral length are discussed will be described below. The dependence of a ratio of an area component of reverse leakage current and a peripheral component of reverse leakage current on the S dose amount is evaluated using p+/n− junction having the same area of $1.6\times10^{-3}$ (cm$^2$) and different peripheral lengths. The area component depends on the junction area, and the peripheral component depends on the peripheral length. FIG. 7 shows the evaluation result. It is found that the area component is extremely decreased when the S dose amount is not lower than about $10^{14}$ (/cm$^2$). The area component, that is, the component depending on a defect amount in a volume in which a depletion layer width is multiplied by a junction area is decreased in a sample into which S ion implantation is performed. This is to suggest that S electrically inactivates the defect in the depletion layer.

Figure 8:
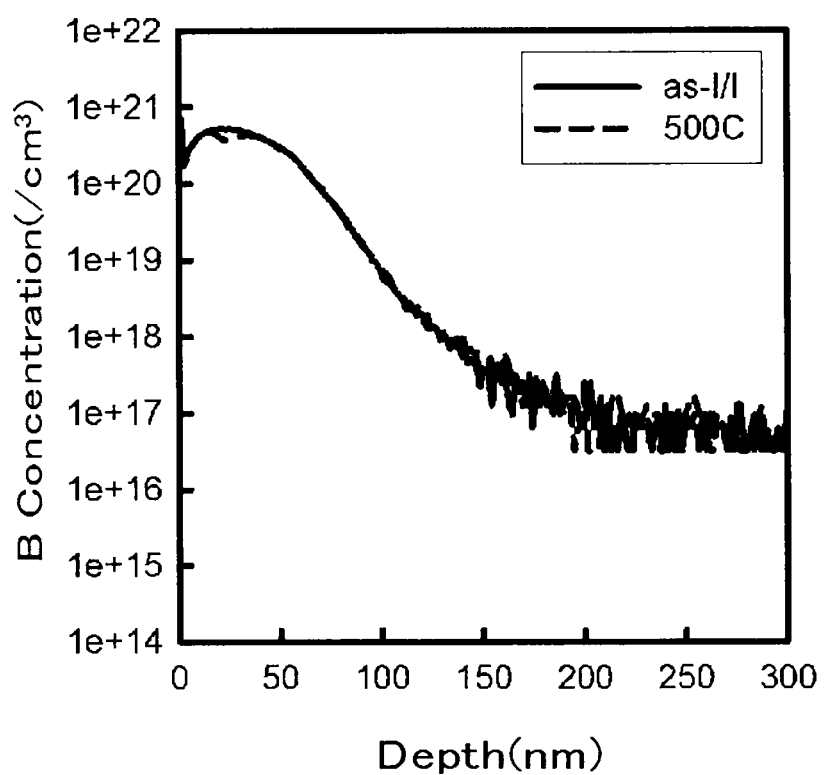
FIG. 8 shows a B concentration profile in a depth direction of a Ge substrate.
Figure 9:
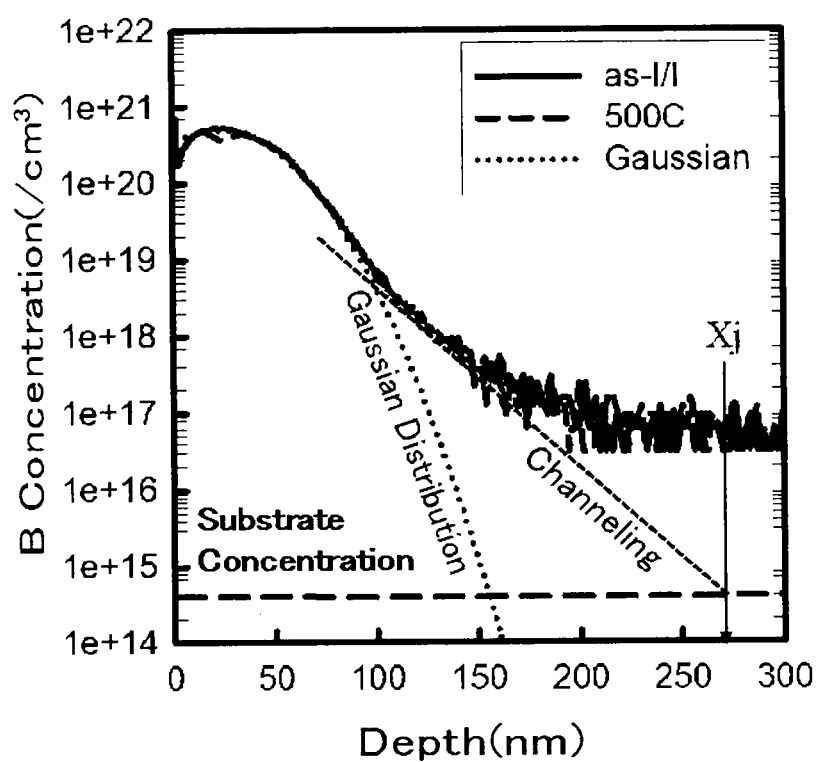
FIG. 9 is an explanatory view explains the B and S concentration profile.
Figure 10:
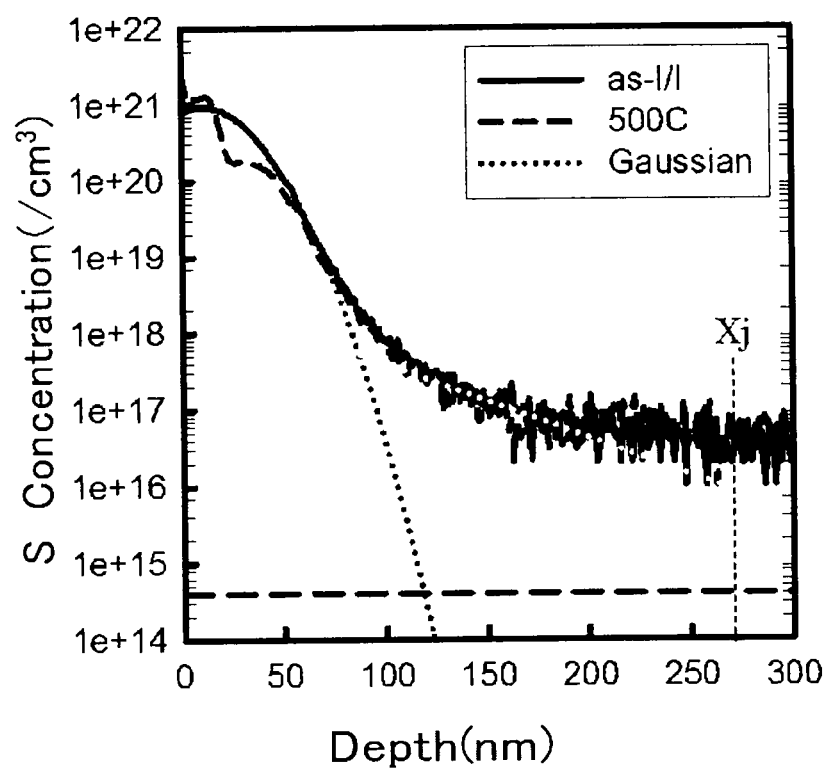
FIG. 10 shows an S concentration profile in a depth direction of the Ge substrate.

Therefore, an S concentration near the junction depth is investigated by SIMS analysis to verify a correlation with the reverse current. FIGS. 8 and 10 show B and S concentration profiles in the depth direction of the Ge substrate after a heat treatment is performed in an N$_2$ gas at 500° C. for 30 minutes and before the heat treatment, respectively. In FIG. 10, the S dose amount is $5\times10^{15}$ (/cm$^2$). FIG. 9 is an explanatory view explains the B and S concentration profile. As shown in FIG. 9, in the region which is deeper than about 100 nm from the substrate surface, it is believed that the channeling has an influence of the shift from the projection range (Rp)-centered Gaussian distribution. The Ge substrate has the impurity concentration of $4\times10^{14}$ (/cm$^3$), and the influence of the channeling is linearly approximated in a single logarithmic chart as shown in FIG. 9, whereby the diffusion layer depth Xj is estimated at about 270 nm. As shown in FIG. 10, the S concentration is $1\times10^{16}$ (/cm$^3$) in the diffusion layer depth Xj. Because it is believed that the channeling is generated in the initial stage of the S ion implantation at which the Ge substrate is in the single crystal state, it is expected that the dependence of the S concentration on the S dose amount is small in the diffusion layer depth Xj. Accordingly, the S concentration of about $1\times10^{16}$ (/cm$^3$) exists near the diffusion layer depth Xj irrespective of the small dependence of the S concentration on the S dose amount.

Although the junction depth Xj is obtained from the SIMS profile, the junction depth Xj may be evaluated by a three-dimensional atomic probe method.

It is found that the S amount near the junction depth Xj of the SIMS result, that is, the S dose amount in the depletion layer is at the same level as the amount N$_T$ and the S amount comparable to the defect amount exists near the defect in the depletion layer. At this point, although the physical reality of the defect is unclear in the depletion layer, one of the reasons why the electric characteristic of the pn junction is improved by introducing S into the Ge substrate is that, assuming that a defect is a Ge hole having an energy level in a band gap Eg which is higher than a valence band of Ge of 0.2 eV, S terminates the Ge dangling bond caused by the defect and achieves electric inactivation. Because the conventionally-reported amount of Ge dangling bond at a room temperature is several figures smaller than the estimated defect amount of about $10^{16}$ (/cm$^3$), actually the defect may be the crystal defect caused by the Ge dangling bond such as the stacking fault and the dislocation derived from the hole.

From the viewpoint of the decrease in junction leakage current, desirably the S concentration is not lower than $1\times10^{16}$ atoms/cm$^3$ in the semiconductor region which is deeper than the junction depth of the source/drain impurity layer.

Figure 11A:
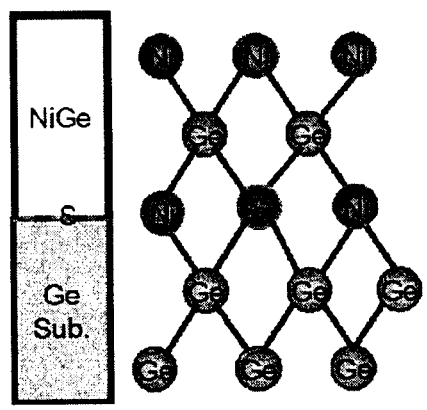
FIG. 11 is an explanatory view showing a difference between a conventional technique and the first embodiment.
Figure 11B:
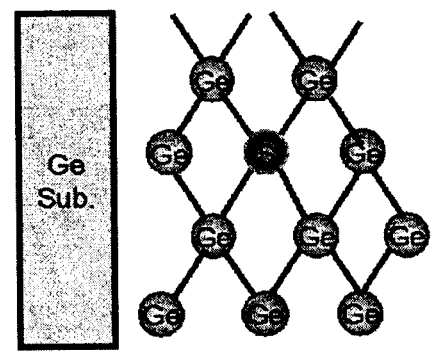

FIG. 11 is an explanatory view showing a difference between the conventional technique described in K. Ikeda, Y. Yamashita, N. Sugiyama, N. Taoka and S. Takagi, Applied Physics Letters, 88, 152115 (2006) and the first embodiment. FIG. 11A is an explanatory view showing the configuration and effect described in K. Ikeda, Y. Yamashita, N. Sugiyama, N. Taoka and S. Takagi, Applied Physics Letters, 88, 152115 (2006), and FIG. 11B is an explanatory view showing the configuration and effect of the first embodiment. In the technique described in K. Ikeda, Y. Yamashita, N. Sugiyama, N. Taoka and S. Takagi, Applied Physics Letters, 88, 152115

(2006), as shown in FIG. 11A, S compensates the dangling bond at the metal/Ge substrate interface to modulates the Schottky barrier. On the other hand, in the first embodiment, as shown in FIG. 11B, S compensates the defect in the depletion layer of the Ge bulk substrate to reduce the junction leakage current, and the first embodiment differs from the technique described in K. Ikeda, Y. Yamashita, N. Sugiyama, N. Taoka and S. Takagi, Applied Physics Letters, 88, 152115 (2006) in the configuration and effect.

Figure 12:
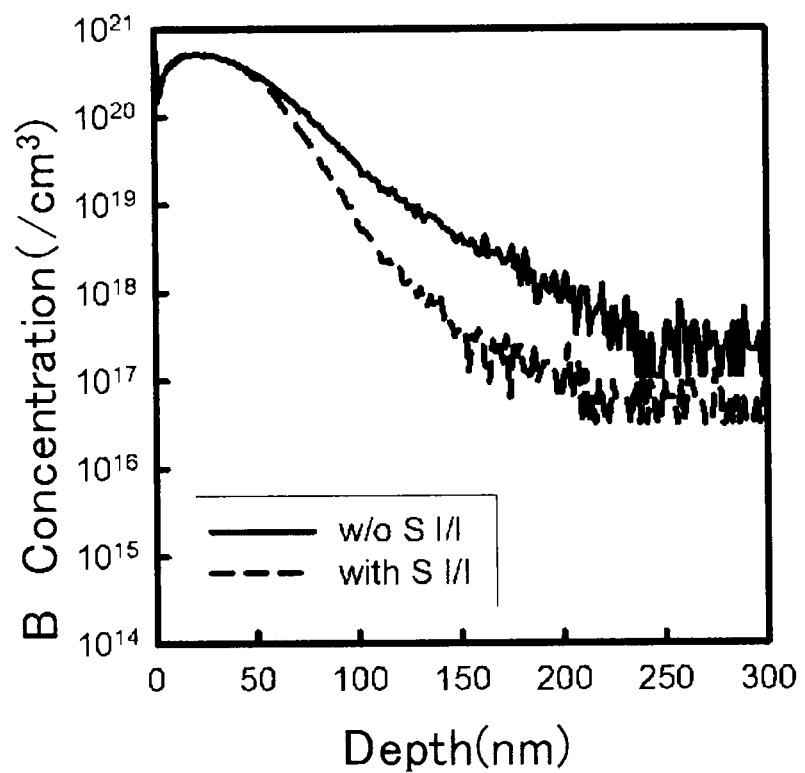
FIG. 12 shows SIMS result in which the B concentration profile in the Ge substrate is changed according to the presence or absence of S ion implantation before B ion implantation.

That the junction of the source/drain impurity layer can be made shallow by performing the S ion implantation before the ion implantation of the dopant such as B in the manufacturing method of the first embodiment will be described below. FIG. 12 shows SIMS result in which the B concentration profile in the Ge substrate is changed according to the presence or absence of the S ion implantation before the B ion implantation.

As can be seen from FIG. 12, the junction depth Xj can be made shallow when the S ion implantation is performed before the B ion implantation. This is attributed to the fact that the Ge substrate is transformed into the amorphous state by the ion implantation of $5 \times 10^{15}$ (/cm$^2$) S to suppress the B channeling.

Figure 13:
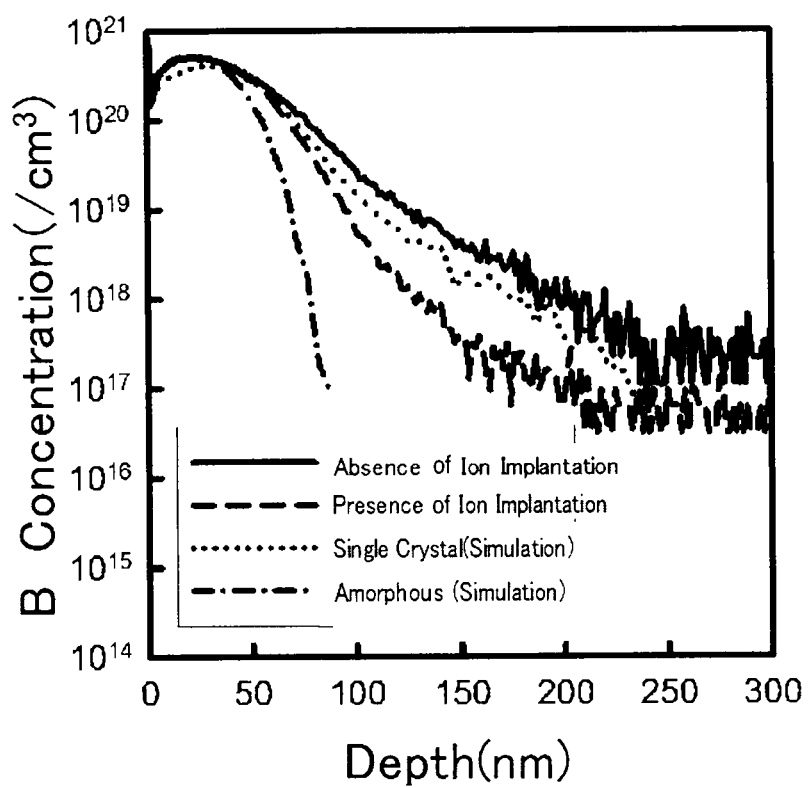
FIG. 13 shows simulation result of the B concentration profile.

A Monte Carlo simulation is performed to confirm the tentative theory. FIG. 13 shows the simulation result. The Monte Carlo simulation is performed for the single-crystal Ge substrate and the amorphous Ge substrate. In the amorphous Ge substrate, the B distribution in the substrate depth direction is suppressed compared with the single-crystal Ge substrate. In the case of the S ion implantation, the B concentration profile is located between the simulation result in the amorphous Ge substrate and the simulation result in the single-crystal Ge substrate. In the ion implantation condition of $5 \times 10^{15}$ (/cm$^2$) S, although the Ge substrate is partially transformed into the amorphous state, the Ge substrate is not sufficiently transformed into the amorphous state.

Generally the amorphous state is easily obtained as an atomic weight of the element is increased. Therefore, desirably Se and Te which belong to the same periodic table group 16 are used rather than S as the element for forming the Ge substrate into the pre-amorphous state before the dopant ion implantation in order to form the shallow junction. The reason why the element for forming the Ge substrate into the pre-amorphous state is limited to the periodic table group 16 is that the Ge dangling bond is terminated to achieve the electric inactivation by forming an sp3 hybrid orbital like S.

Figure 14A:
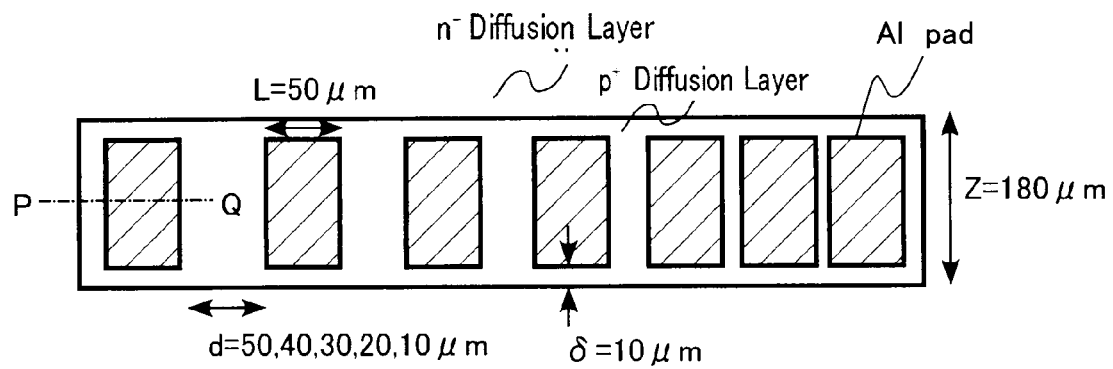
FIG. 14A is a top view showing a device structure used in evaluating the sheet resistance and the contact resistance in the first embodiment.
Figure 14B:
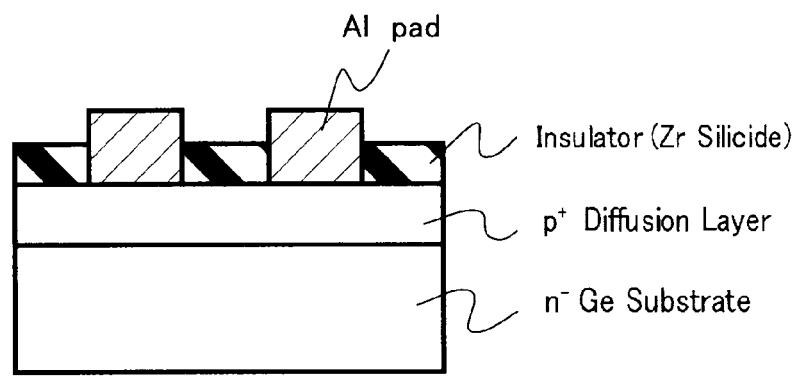
FIG. 14B is a sectional view taken on a line PQ of FIG. 14A.

The result of the influence of the S ion implantation on a sheet resistance and a contact resistance of the source/drain impurity layer will be described below. FIG. 14 shows an device structure used in evaluating the sheet resistance and the contact resistance. FIG. 14A is a top view showing the device structure, and FIG. 14B is a sectional view taken on a line PQ of FIG. 14A.

Figure 15:
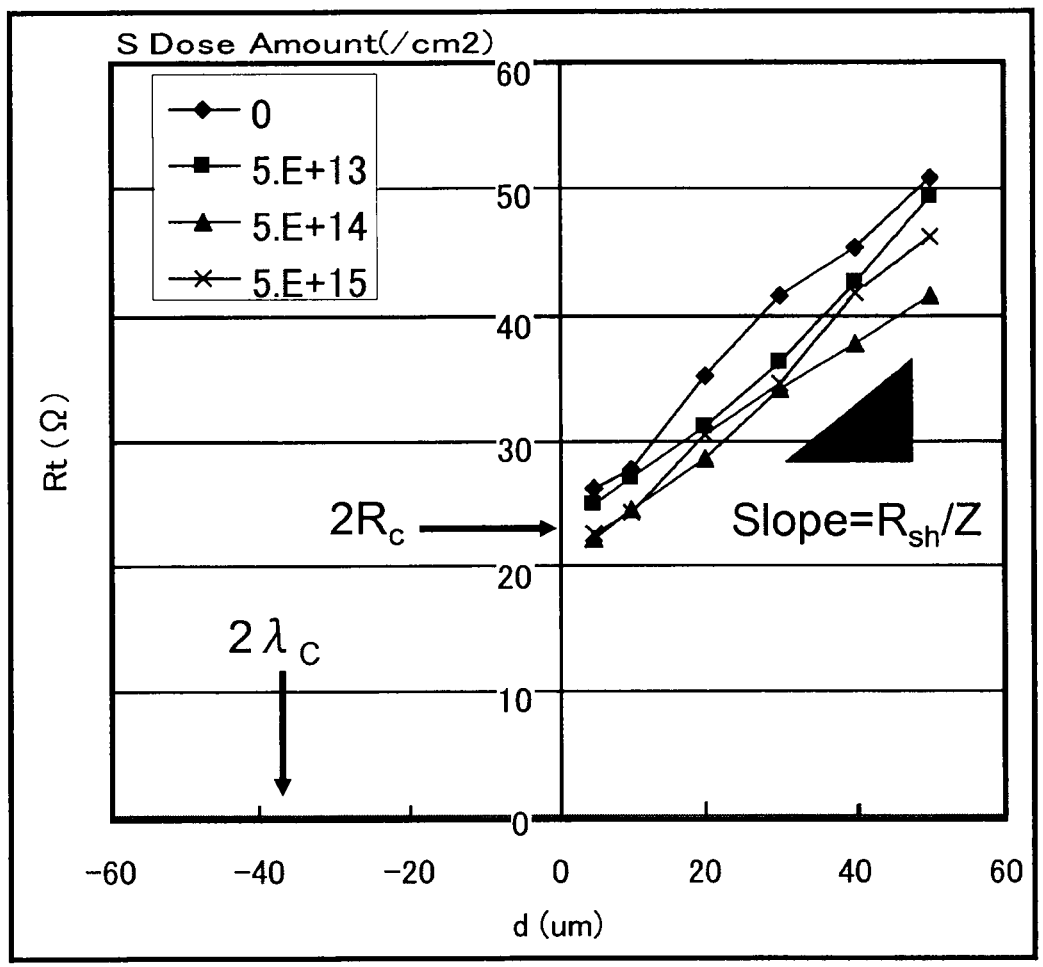
FIG. 15 shows evaluation results of a sheet resistance and a contact resistance in the first embodiment.

FIG. 15 shows the evaluation results of the sheet resistance and the contact resistance. Probes of a measuring apparatus are put on two Al pads of FIG. 14 to apply a voltage, and a current passed through the diffusion layer between the pads is measured to calculate a total resistance Rt. FIG. 15 shows a graph in which the total resistance Rt is measured for devices having different pad intervals d. A sheet resistance Rsh can be calculated from a gradient, and a contact resistance Rc at an Al/p+ diffusion layer interface can be calculated from a y-axis intercept. A contact characteristic length λc at the Al/p+ diffusion layer interface can also be calculated from an x-axis intercept. Because the contact characteristic length λc is shorter than Z of FIG. 14A, a contact resistance resistivity ρc can be calculated as Rc×λc×Z. The sheet resistance Rsh of 100 (Ω/□) and the contact resistance resistivity ρc of $4 \times 10^{14}$ (Ωcm$^2$) are calculated from FIG. 15, and the sheet resistance Rsh and the contact resistance resistivity ρc are substantially independent of the S dose amount.

As is well known, because S has a donor state in the Ge band gap Eg which is lower than a Ge conduction band by 0.18 eV, S in the p+ diffusion layer acts as the n-type dopant to possibly lower the activation concentration of the p+ diffusion layer. However, the problem is not generated because the sheet resistance Rsh and the contact resistance resistivity ρc are independent of the S dose amount as described above. Because the S solid solubility limit in Si is as low as about $10^{16}$ (/cm$^3$), it is analyzed that the S solid solubility limit is also low in Ge, and the donor activation concentration caused by S is suppressed to about $10^{16}$ (/cm$^3$). Thus, S in the p+ diffusion layer has no influence on the activation concentration of the p+ diffusion layer. There is also fear that S increases the resistance value by simply acting as a scattering source of the carrier which plays a role of the current. However, it is found that S has a little influence on the increase in resistance value.

In the first embodiment, mainly S is introduced into the Ge substrate. However, even if Se or Te which belongs to the same periodic table group 16 is used, the same effect can be obtained.

In the first embodiment, ZrSiO is used as the gate insulator by way of example. Alternatively, materials such as a silicon oxide film, a germanium oxynitride, $La_2O_5$, $La_2O_3$, $CeO_2$, $ZrO_2$, $HfO_2$, $SrTiO_3$, $PrO_3$, $LaAlO_3$, $Si_3N_4$, $Al_2O_3$, $Ta_2O_5$, and $TiO_2$ may be used as the gate insulator.

For example, a single metal such as Ti, Ta, and W, a silicide, a nitride, and a carbide thereof, or Si or SiGe may be used as the gate electrode.

In the source/drain portion, a metal electrode made of NiGe or the like may be provided to reduce the resistance.

In the first embodiment, p-MISFET is described. However, because the electron mobility is improved compared with Si in the channel region containing Ge, the same effect can be obtained even if the invention is applied to n-MISFET.

(Second Embodiment)

A semiconductor device according to a second embodiment is basically similar to the semiconductor device of the first embodiment except that the S, Se, or Te concentration is not more than $1 \times 10^{19}$ atoms/cm$^3$ in part of the channel region located immediately below the gate insulator. Accordingly, the description of overlapping contents is omitted.

Figure 16:
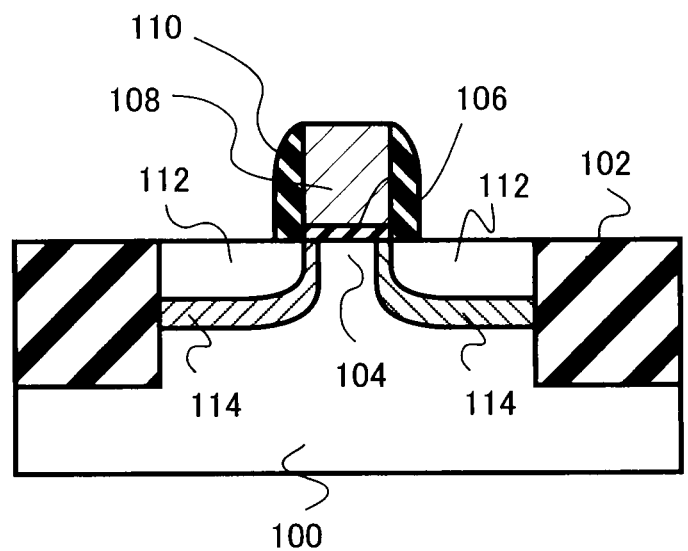
FIG. 16 is a sectional view showing a semiconductor device according to a second embodiment.

FIG. 16 is a sectional view showing the semiconductor device of the second embodiment. As shown in FIG. 16, the region 114 containing S is not formed in the central portion of the channel region 104 of p-MISFET, that is, immediately below the gate insulator in the channel region except for the neighborhoods of the junctions of the source/drain diffusion layers 112.

A method for manufacturing the semiconductor device of FIG. 16 will be described below. The manufacturing method of the second embodiment is basically similar to the manufacturing method of the first embodiment except that the S ion implantation process is performed after the gate electrode forming process. Accordingly, the description of overlapping contents is omitted.

Figure 17:
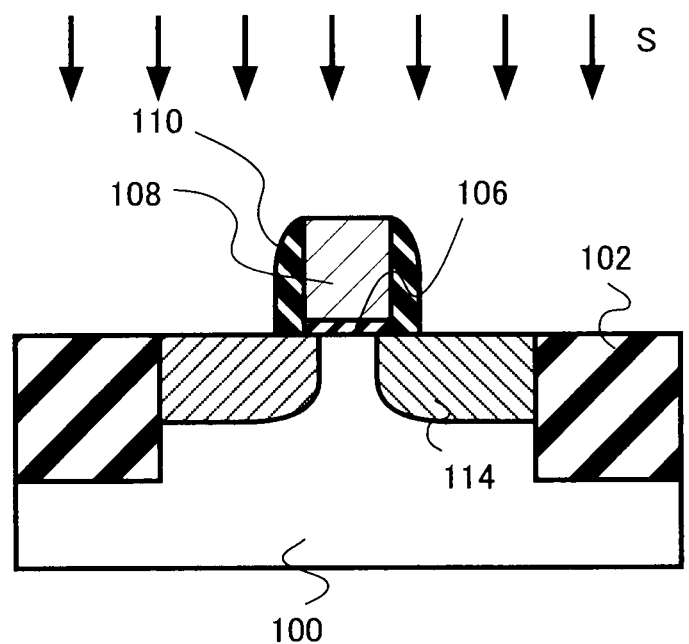
FIGS. 17 and 18 are sectional views showing a process of manufacturing the semiconductor device of the second embodiment.
Figure 18:
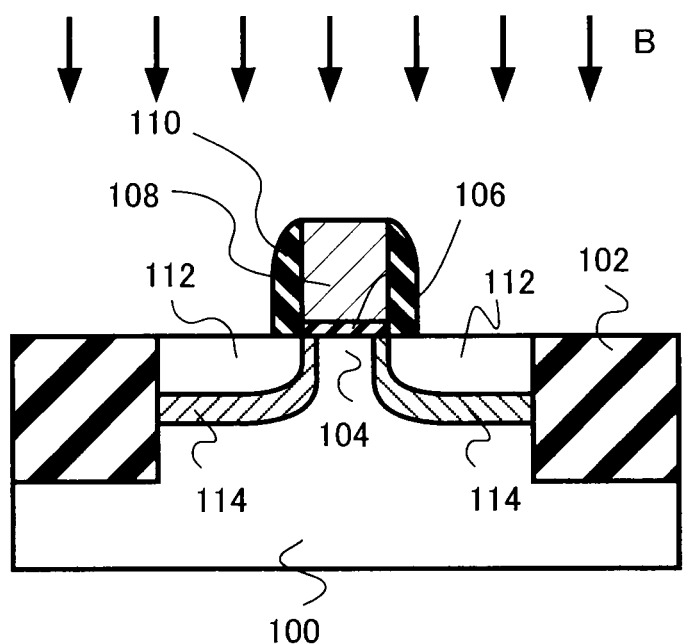

FIGS. 17 and 18 are sectional views showing a process of manufacturing the semiconductor device of the second embodiment. As shown in FIG. 17, the gate electrode 108 is formed, and the gateside wall insulator 110 is formed. After the silicon oxide film (not shown) is deposited to about 10 nm by the sputtering method, S is introduced into the Ge substrate 100 by the ion implantation with the gate electrode 108 and gate sidewall insulator 110 as a mask. Therefore, the semiconductor regions 114 containing S are formed only on both sides of the gate electrode 108. In the ion implantation, the implantation condition is set such that S is implanted into the region deeper than the junction depth of the later-formed source/drain impurity layer.

As shown in FIG. 18, the source/drain impurity layer is formed by the B ion implantation. Then the annealing is performed at 500° C. in order to activate B or S. Thus, the semiconductor device having the structure shown in FIG. 16 is formed.

In the semiconductor device of the second embodiment, the S concentration is decreased immediately below the gate insulator of the channel region, and the interface state is lowered at the gate insulator/Ge substrate interface. Therefore, the MISFET characteristic degradation caused by the interface state is suppressed.

Figure 19:
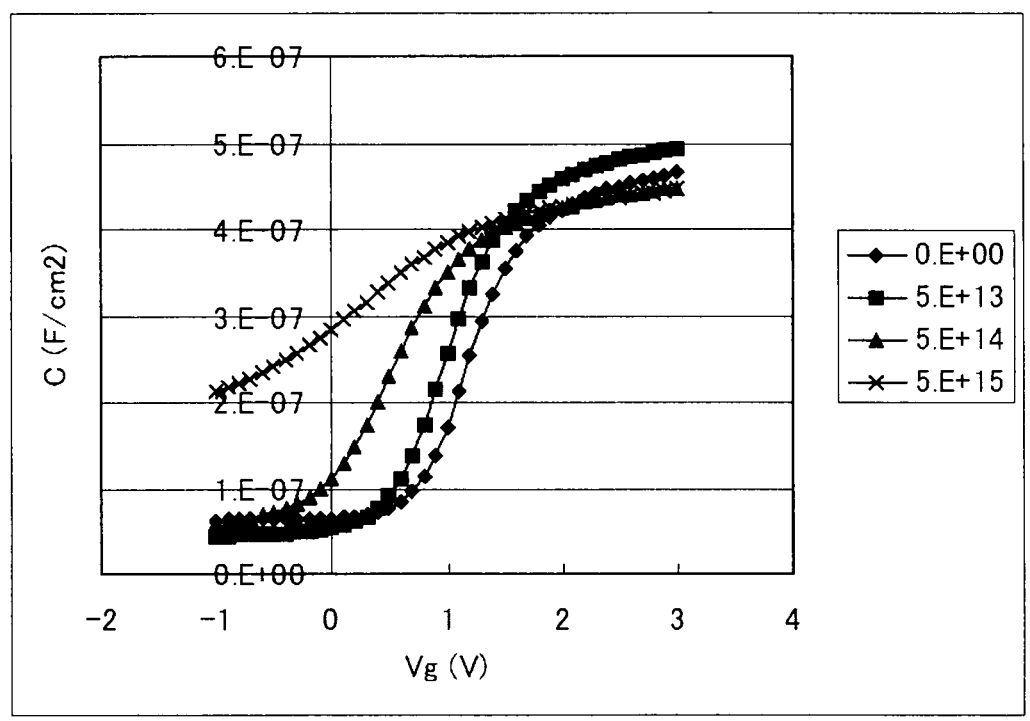
FIG. 19 shows a CV characteristic of an MIS capacitor having a structure of the first embodiment.

FIG. 19 shows a CV characteristic of an MIS capacitor having a structure of the first embodiment. As can be seen from FIG. 19, the CV characteristic is stretched in the horizontal direction as the S dose amount is increased, and the interface state is increased. Particularly the CV characteristic is significantly varied when the B dose amount is more than $5 \times 10^{13}$ (/cm$^2$). In consideration of both the results of FIG. 19 and the first embodiment, although S effectively terminates the defect in the Ge substrate, S hardly terminates the interface state of the insulator/Ge substrate interface to achieve the electric inactivation. Therefore, S is effectively introduced only into the source/drain region to a limited extent, and desirably S does not exist at the insulator/Ge substrate interface immediately below the gate electrode.

Because the impurity introduced by the ion implantation is distributed not only in the substrate depth direction but also in the substrate in-plane direction, S introduced into the source/drain region to the limited extent is also distributed immediately below the gate particularly at a source/drain end. There is a fear that the S concentration is increased immediately below the central portion of the gate as the gate length is shortened. The permissible S concentration immediately below the central portion of the gate is estimated as follows.

The surface S concentration is about $1 \times 10^{21}$ (/cm$^3$) in the case of the S dose amount of $5 \times 10^{15}$ (/cm$^3$). Given the little diffusion of S after the heat treatment and proportionality of the maximum peak concentration or surface concentration to the dose amount, the surface concentration is about $1 \times 10^{19}$ (/cm$^3$) in the case of the S dose amount of $5 \times 10^{13}$ (/cm$^2$). Therefore, when the S surface concentration is not more than $1 \times 10^{19}$ (/cm$^3$), it is thought that the MIS characteristic is not degraded, and desirably the S concentration is not more than $1 \times 10^{19}$ (/cm$^3$) in part of the channel region immediately below the gate insulator, for example, immediately below the central portion of the gate electrode.

In the second embodiment, the S ion implantation is performed before the ion implantation of B which is of the dopant. For the viewpoint of suppression of the B channeling, desirably the S ion implantation is performed before the B ion implantation. However, the S ion implantation maybe performed after the B ion implantation.

(Third Embodiment)

A semiconductor device according to a third embodiment is basically similar to the semiconductor device of the second embodiment except that the S, Se, or Te concentration is not more than $1 \times 10^{19}$ atoms/cm$^3$ in the whole channel region located immediately below the gate insulator. Accordingly, the description of overlapping contents is omitted.

Figure 20:
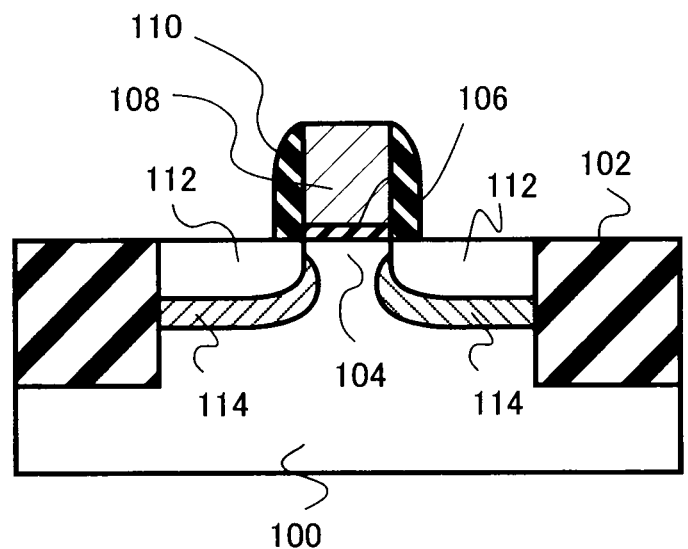
FIG. 20 is a sectional view showing a semiconductor device according to a third embodiment.

FIG. 20 is a sectional view showing a semiconductor device according to a third embodiment of the invention. As shown in FIG. 20, the region 114 containing S is not formed immediately below the gate insulator 106 of the channel region 104 of p-MISFET.

The method for manufacturing the semiconductor device of FIG. 20 is basically similar to that of the second embodiment except that the S ion implantation is performed under such a condition that the S concentration is sufficiently lowered near the semiconductor surface (immediately below the gate insulator), for example, at a high acceleration voltage. Accordingly, the description of overlapping contents is omitted.

In the semiconductor device of the third embodiment, the S concentration is lowered in the whole region immediately below the gate insulator of the channel region, and the interface state is lowered at the gate insulator/Ge substrate interface. Therefore, in addition to the effect of the second embodiment, the MISFET characteristic degradation caused by the interface state is further suppressed.

(Fourth Embodiment)

A semiconductor device according to a fourth embodiment is basically similar to the semiconductor device of the first embodiment except that the S, Se, or Te concentration is not more than $1 \times 10^{19}$ atoms/cm$^3$ in the whole channel region located immediately below the gate insulator. Accordingly, the description of overlapping contents is omitted.

Figure 21:
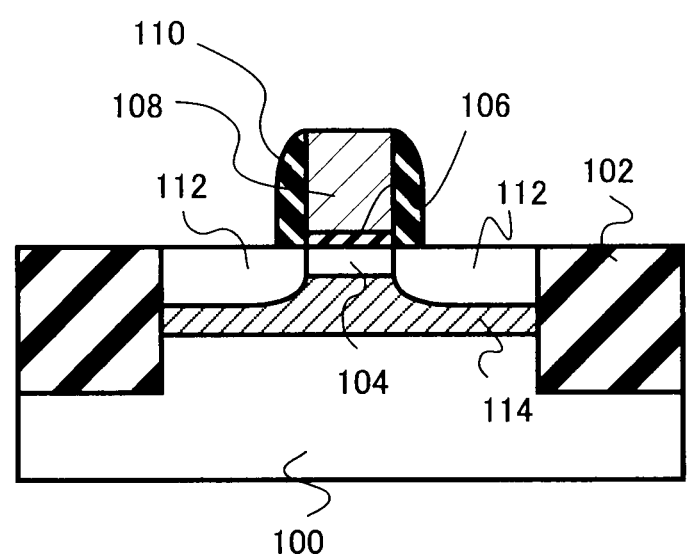
FIG. 21 is a sectional view showing a semiconductor device according to a fourth embodiment.

FIG. 21 is a sectional view showing a semiconductor device according to a fourth embodiment of the invention. As shown in FIG. 21, the region 114 containing S is not formed immediately below the gate insulator 106 of the channel region 104 of p-MISFET.

The method for manufacturing the semiconductor device of FIG. 21 is basically similar to that of the first embodiment except that the S ion implantation is performed under such a condition that the S concentration is sufficiently lowered near the semiconductor surface, for example, at a high acceleration voltage. Accordingly, the description of overlapping contents is omitted.

In the semiconductor device of the fourth embodiment, the S concentration is lowered in the whole region immediately below the gate insulator of the channel region, and the interface state is lowered at the gate insulator/Ge substrate interface. Therefore, in addition to the effect of the first embodiment, the MISFET characteristic degradation caused by the interface state is further suppressed.

(Fifth Embodiment)

A semiconductor device according to a fifth embodiment is basically similar to the semiconductor device of the third embodiment except that the semiconductor substrate is formed by the Si substrate, the channel region is made of Si, and the semiconductor region containing Ge is formed only in the source/drain region. Accordingly, the description of overlapping contents is omitted.

Figure 22:
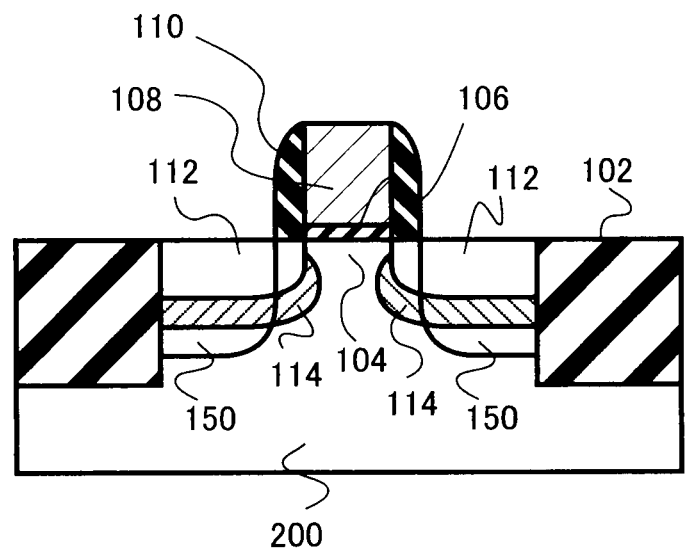
FIG. 22 is a sectional view showing a semiconductor device according to a fifth embodiment.

FIG. 22 is a sectional view showing a semiconductor device according to a fifth embodiment of the invention. The shallow trench isolation 102 whose trench is filled with the silicon oxide film is provided in an n-type Si substrate 200. The channel region 104 of p-MISFET is formed in the Si substrate 200. In p-MISFET, the gate insulator 106 made of the zirconium silicate (ZrSiO) is formed in the surface of the channel region 104. The gate electrode 108 made of a metal is formed on the gate insulator 106. The gate sidewall insulators 110 are formed in both side faces of the gate electrode 108. Ge single-crystal semiconductor regions 150 are formed only in the source/drain regions. The source/drain impurity layers 112 (source/drain diffusion layers) in which B is used as the impurity are formed on both sides of the channel region 104. Part of the both source/drain impurity layers 112 are formed in the semiconductor region 150. The region 114 containing S which is of the periodic table group 16 is formed in a region which is part of the semiconductor region 150, and which is deeper than the junction depth of the source/drain impurity layer 112.

Figure 23:
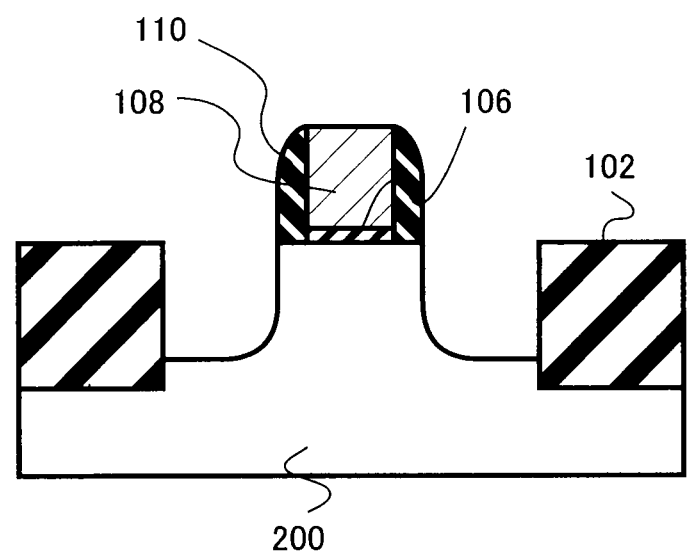
FIGS. 23 to 26 are sectional views showing a process of manufacturing the semiconductor device of the fifth embodiment.

A method for manufacturing the semiconductor device of FIG. 22 will be described below. FIGS. 23 to 26 are sectional views showing a process of manufacturing the semiconductor device of the fifth embodiment. As shown in FIG. 23, the gate electrode 108 is formed, and the gate sidewall insulator 110 is formed. Then the Si substrate is etched by the RIE method with the gate electrode 108, gate sidewall insulator 110, and shallow trench isolation 102 as the mask.

Figure 24:
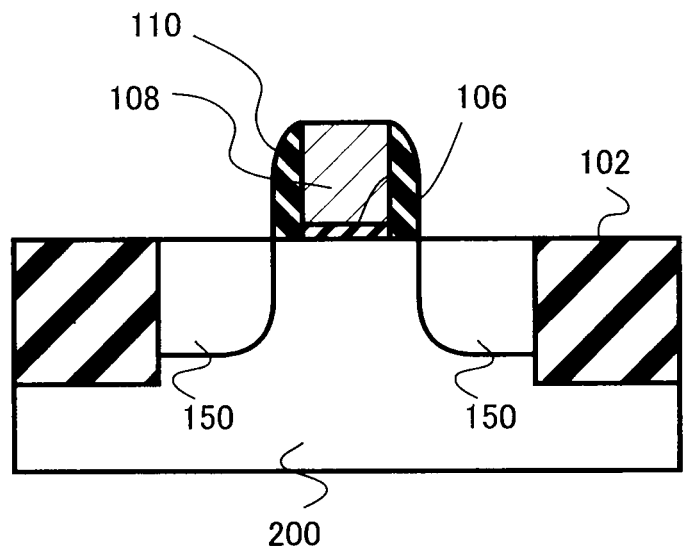
Figure 25:
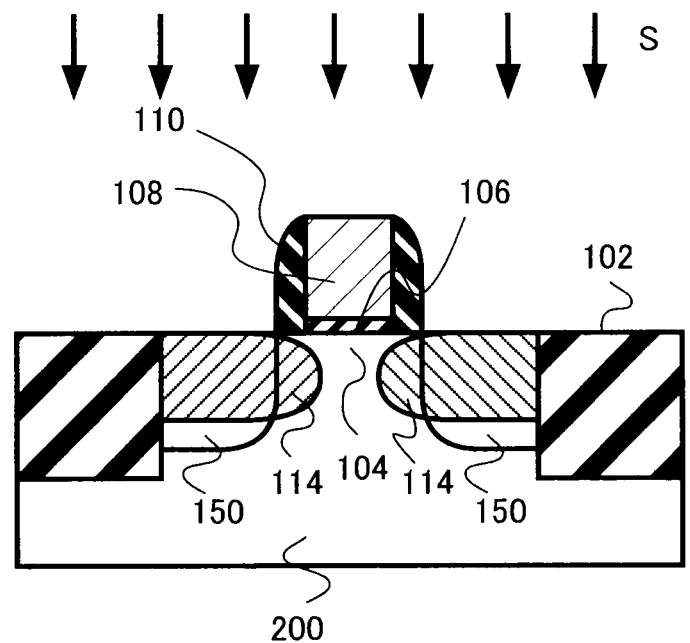

As shown in FIG. 24, the Ge single-crystal semiconductor regions 150 are grown on the Si substrate 200 located on both sides of the gate electrode 108 by a selective epitaxial growth method. As shown in FIG. 25, after the silicon oxide film (not shown) is deposited to about 10 nm by the sputtering method, S is introduced into the Ge single-crystal semiconductor region 150 by the ion implantation with the gate electrode 108 and gate sidewall insulator 110 as the mask. Therefore, the semiconductor regions 114 containing S are formed only both sides of the gate electrode 108. In the S ion implantation, the implantation condition is set such that S is implanted deeper than the junction depth of the later-formed source/drain impurity layer.

Figure 26:
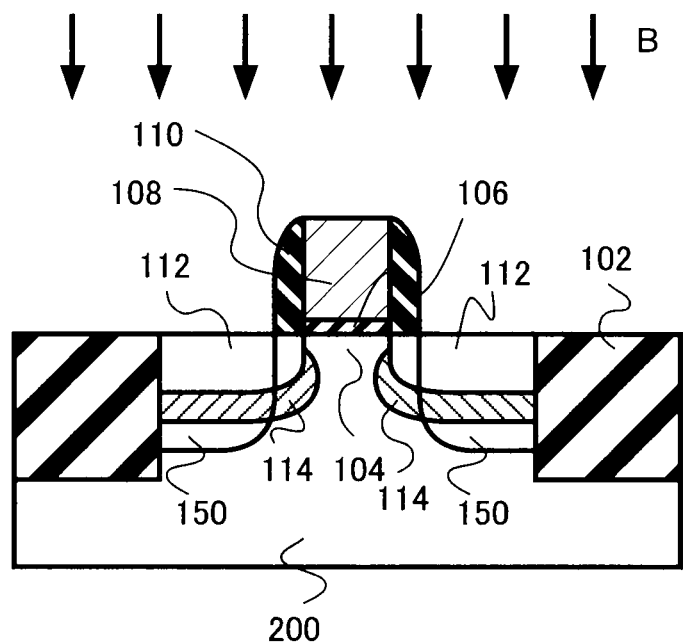

As shown in FIG. 26, the source/drain impurity layer is formed by the B ion implantation. Then the annealing is performed at 500° C. in order to activate B or S. Thus, the semiconductor device having the structure shown in FIG. 22 is formed.

In the semiconductor device of the fifth embodiment, the distortion is applied to Si of the channel region to improve the hole mobility by Ge embedded in the source/drain region, which allows the realization of the improvement of the p-MISFET performance. Additionally the existence of Si realizes the reduction of the junction leakage current in the source/drain impurity layer formed in Ge of the source/drain region.

In the fifth embodiment, Ge is embedded in the source/drain region. Alternatively, $Si_{1-x}Ge_x$ (0<x<1) may be embedded in the source/drain region.

(Sixth Embodiment)

A semiconductor device according to a sixth embodiment has a CMIS structure which includes p-MISFET and n-MISFET, and the invention is applied only to p-MISFET.

Figure 27:
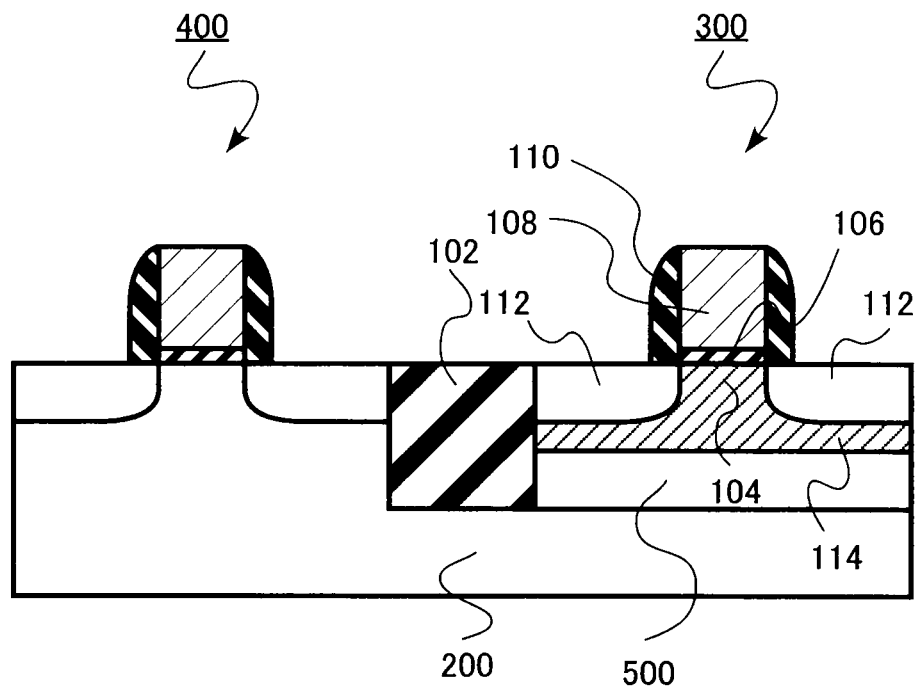
FIG. 27 is a sectional view showing a semiconductor device according to a sixth embodiment.

FIG. 27 is a sectional view showing the semiconductor device of the sixth embodiment. A p-MISFET 300 and an n-MISFET 400 are formed in the Si substrate 200. The p-MISFET 300 and the n-MISFET 400 are electrically separated by the shallow trench isolation 102. The p-hISFET 300 is formed in a Ge semiconductor region 500. The p-MISFET 300 has a structure similar to that of the semiconductor device of the first embodiment of FIG. 1.

With reference to the method for preparing the Ge semiconductor region of the semiconductor device of FIG. 27, the trench isolation is formed on the usual Si substrate, the etch back is performed to the Si substrate region of the p-MISFET region, and Ge epitaxial growth is directly performed on the Si substrate by the CVD method using a $GeH_4$ gas.

For both the electron and hole, the carrier mobility in Ge is larger than that in Si. However, because the n-type impurity of n-MISFET on the Ge substrate has the small activation concentration, n-MISFET on the Ge substrate is inferior in the transistor characteristic to n-MISFET on the Si substrate. Therefore, desirably the semiconductor device of the sixth embodiment in which only p-MISFET is made of Ge is used in the case of the semiconductor device having the CMIS structure.

Thus, the embodiments are described with reference to the specific examples. However, the embodiments are described only by way of example, and the invention is not limited to the embodiments. In the embodiments, the portion which is not necessary for the description of the invention is omitted in the semiconductor device and the semiconductor device manufacturing method. However, necessary elements relating to the semiconductor device and semiconductor device manufacturing method can appropriately be selected and used.

For example, in the embodiments, mainly Ge is used as the semiconductor substrate containing Ge or the semiconductor region containing Ge. However, the invention is not limited to Ge, but $Si_{1-x}Ge_x$ (0<x<1) may be used as long as the semiconductor substrate or semiconductor region contains Ge. In such cases, the same effect as Ge is obtained. This is attributed to the fact that both the Ge—Ge bond and Ge—Si bond are easily cut to generate the dangling bond because the Ge—Ge bond and Ge—Si bond have bond energy smaller than that of the Si—Si bond. Accordingly, similarly to Ge, the effect that the dangling bond is compensated to reduce the junction leakage current by introducing S, Se, or Te into the source/drain impurity layer depletion layer is obtained even in $Si_{1-x}Ge_x$ (0<x<1).

As shown in the conventional technique, when Ge in $Si_{1-x}Ge_x$ is not lower than 0.87, that is, when the Ge concentration is not lower than 87 atomic percent, the band gap Eg of SiGe depends on an L point of Ge, and the band gap Eg of SiGe is rapidly decreased. Therefore, the invention is effective in the case where the Ge concentration is not lower than 87 atomic percent. Accordingly, desirably the Ge concentration is not lower than 87 atomic percent in the semiconductor substrate containing Ge or the semiconductor region containing Ge.

Furthermore, the semiconductor device and semiconductor device manufacturing method provided with the element of the invention, in which the design is appropriately changed by those skilled in the art, shall be included in the scope of the invention. The scope of the invention shall be defined only by claims and the equivalent thereto.

What is claimed is:

1. A semiconductor device comprising:
   a semiconductor substrate;
   a channel region formed in the semiconductor substrate;
   a gate insulator formed on a surface of the channel region;
   a gate electrode formed on the gate insulator;
   source/drain diffusion layers formed on both sides of the channel region, the source/drain diffusion layers being made of semiconductor including Boron (B) as an impurity and a concentration of B in the source/drain diffusion layers being more than $10^{20}/cm^3$;
   an n-type semiconductor region in the semiconductor substrate containing Ge; and
   an element containing region containing S, the element containing region being formed in the semiconductor region and the element containing region being deeper than a junction depth of the source/drain diffusion layers,
   wherein the channel region, the gate insulator, the gate electrode and the source/drain diffusion layers forms a p-MISFET,
   at least part of both of the source/drain diffusion layers are formed in the semiconductor region,
   pn junctions are formed between the source/drain diffusion layers and the element containing region, a concentration of S is not more than $1\times10^{19}$ atoms/cm$^3$ in at least part of the channel region located immediately below the gate insulator, a concentration of S is not lower than $1\times10^{16}$ atoms/cm$^3$ in the element containing region, the channel region contains Ge, and a Ge concentration of the n-type semiconductor region is not lower than 87 atomic percent.

2. The device according to claim 1, further comprising metal electrodes provided on the source/drain diffusion layers.

* * * * *